(12) United States Patent
Mentovich et al.

(10) Patent No.: US 11,128,500 B1
(45) Date of Patent: Sep. 21, 2021

(54) METHOD AND APPARATUS FOR A LOOKUP TABLE-BASED CODING MECHANISM FOR COMMUNICATION SYSTEMS

(71) Applicant: Mellanox Technologies, Ltd., Yokneam (IL)

(72) Inventors: Elad Mentovich, Tel Aviv (IL); Juan Jose Vegas Olmos, Solrod Strand (DK)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 16/891,450

(22) Filed: Jun. 3, 2020

(51) Int. Cl.
| | |
|---|---|
| *H04B 7/06* | (2006.01) |
| *H04L 25/49* | (2006.01) |
| *H04L 27/36* | (2006.01) |
| *H03M 7/16* | (2006.01) |
| *H04L 25/497* | (2006.01) |
| *H04L 1/00* | (2006.01) |

(52) U.S. Cl.
CPC .......... *H04L 25/4917* (2013.01); *H03M 7/16* (2013.01); *H04B 7/0626* (2013.01); *H04L 1/0026* (2013.01); *H04L 25/4975* (2013.01); *H04L 27/367* (2013.01)

(58) Field of Classification Search
CPC ............. H04L 25/4917; H04L 25/4975; H04L 27/367; H04L 1/0026; H04B 7/0626; H03M 7/16
See application file for complete search history.

(56) References Cited

U.S. PATENT DOCUMENTS

| 10,749,594 B1 * | 8/2020 | O'Shea | ............... H04B 7/18513 |
| 2018/0006700 A1 * | 1/2018 | Frenne | .................. H04B 7/0626 |
| 2020/0351868 A1 * | 11/2020 | Zhang | ............... H04W 36/0058 |

OTHER PUBLICATIONS

Jian Qiao, Makoto Ikeda, Kunihiro Asada—Finding Optimal Functional Decomposition for LUT-based FPGA Systhesis—Jun. 2001 (Year: 2001).*

* cited by examiner

*Primary Examiner* — Dac V Ha
(74) *Attorney, Agent, or Firm* — Alston & Bird LLP

(57) ABSTRACT

Embodiments are disclosed for a lookup table-based coding mechanism for communication systems. An example method includes receiving a signal to be transmitted, converting the signal into a converted analog signal using a digital to analog converter, receiving channel state information for a channel, calibrating the lookup table based on the channel state information, utilizing the calibrated lookup table to generate a coded analog signal based on the converted signal, and transmitting the coded analog signal, wherein the coded signal compensates for channel distortion of the channel.

20 Claims, 7 Drawing Sheets

METHOD AND APPARATUS FOR A LOOKUP TABLE-BASED CODING MECHANISM FOR COMMUNICATION SYSTEMS

TECHNOLOGICAL FIELD

Embodiments of the present invention relate generally to a method and apparatus for a lookup table-based coding mechanism for communication systems.

BACKGROUND

The present invention relates to a method and apparatus for a lookup table-based coding mechanism for communication systems. Communication systems are generally composed of a transmitter, a receiver, and a channel. The transmitter generates a signal conveying information, which, after being transmitted over a channel, is received and recovered at the receiver.

Information in the form of symbols embedded in the signal is generally set by the transmitter, and the symbol frequency, symbol phase, and symbol timing may be recovered by the receiver. In the real world, transmission channels are non-ideal and introduce various unwanted effects that cause distortion of the signals. Therefore, in order to recover the information transmitted in the signal, the symbol frequency, symbol phase, and symbol timing of the received signal need to be accurately recoverable so that the received signal is synchronous with the transmitted signal and the symbol error probability is decreased while detecting the symbols. Precoding, such as dirty paper coding or Costa precoding, may be utilized in certain conventional systems at the transmitter to make the received signal more recoverable.

BRIEF SUMMARY

Example embodiments of the present invention relate generally to a method and apparatus for lookup table circuit-based coding mechanism for communication systems. The details of some embodiments of the subject matter described in this specification are set forth in the accompanying drawings and the description below. Other features, aspects, and advantages of the subject matter will become apparent from the description, the drawings, and the claims.

In an embodiment, a method for coding a signal to be transmitted via a communication channel is provided. The method includes receiving a signal to be transmitted. The method also includes converting the signal into a converted analog signal using a digital to analog converter. Furthermore, the method includes receiving channel state information for a channel. The method also includes calibrating the lookup table based on the channel state information. The method also includes utilizing the calibrated lookup table to generate a coded analog signal based on the converted signal. Furthermore, the method includes transmitting the coded analog signal, where the coded signal compensates for channel distortion of the channel.

In another embodiment, an apparatus in a transmitter comprises at least one processor and at least one memory including computer program code. The at least one memory and the computer program code are configured to, with the at least one processor: receive a signal to be transmitted, convert the signal into a converted analog signal using a digital to analog converter, receive channel state information for a channel, calibrate the lookup table based on the channel state information, utilize the calibrated lookup table to generate a coded analog signal based on the converted signal, and transmit the coded analog signal, wherein the coded signal compensates for channel distortion of the channel.

In some embodiments, the signal to be transmitted is a pulse amplitude modulation 4 (PAM-4) signal. In some embodiments, the converted analog signal comprises three eyes, and the coded analog signal comprises three eyes. In some embodiments, the coded analog signal is Gray coded by utilizing the lookup table. In some embodiments, the coded analog signal is Costa precoded by utilizing the lookup table. In some embodiments, the coded analog signal is Tomlinson-Harashima coded by utilizing the lookup table.

In some embodiments, utilizing the lookup table to generate a coded analog signal based on the converted signal comprises transmitting a handshake signal to a receiver, receiving a handshake reply signal from the receiver indicating that the receiver is configured to decrypt a Tomlinson-Harashima coded received signal by utilizing a receiver-side lookup table embedded in a receiver-side chipset with a central processing unit (CPU), and configuring the calibrated lookup table to perform Tomlinson-Harashima coding. In some embodiments, the receiver-side lookup table is adjustable.

In some embodiments, wherein utilizing the lookup table to generate a coded analog signal based on the converted signal comprises transmitting a handshake signal to a receiver, receiving a handshake reply signal from the receiver indicating that the receiver is configured to decrypt a Tomlinson-Harashima coded received signal by utilizing a field-programmable gate array (FPGA), and configuring the calibrated lookup table to perform Tomlinson-Harashima coding.

In some embodiments, the lookup table is further configured to include equalization.

The above summary is provided merely for purposes of summarizing some example embodiments to provide a basic understanding of some aspects of the present invention. Accordingly, it will be appreciated that the above-described embodiments are merely examples and should not be construed to narrow the scope or spirit of the present invention in any way. It will be appreciated that the scope of the present invention encompasses many potential embodiments in addition to those here summarized, some of which will be further described below.

BRIEF DESCRIPTION OF THE DRAWINGS

Figure 1:
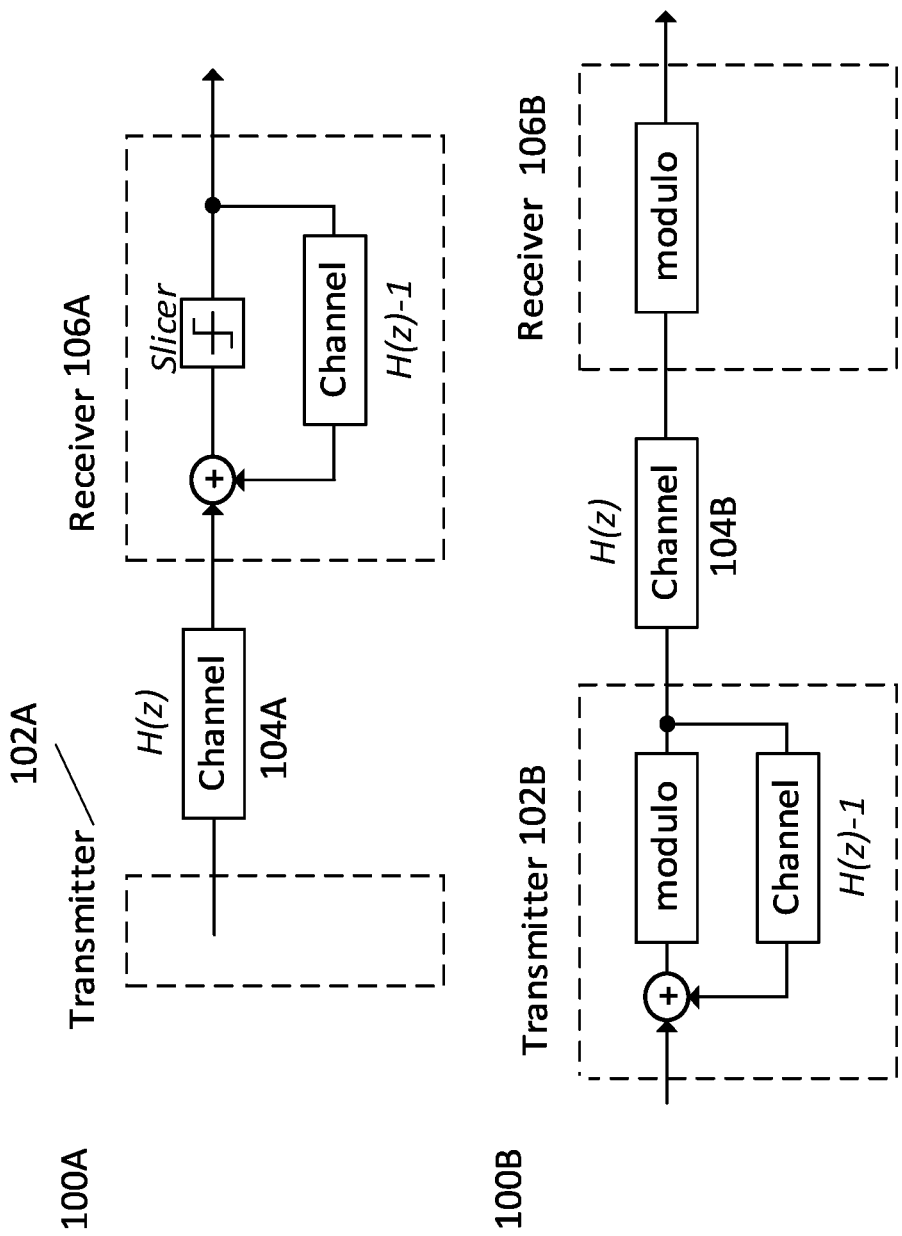
Figure 2:
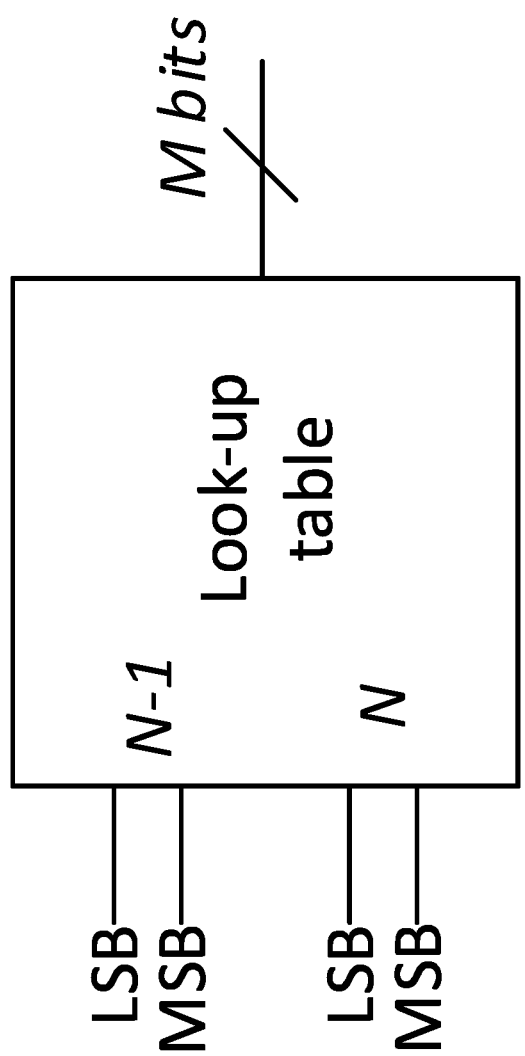
Figure 3:
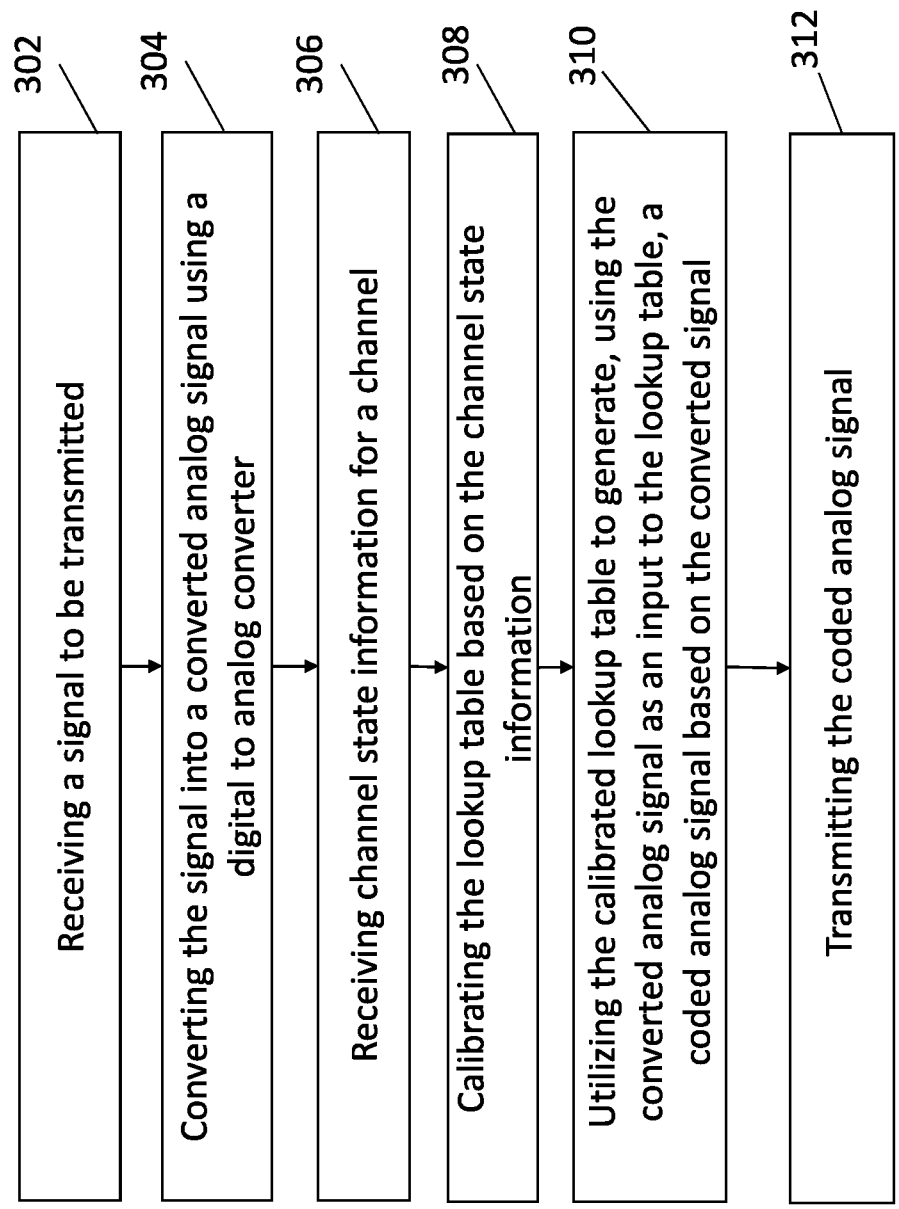
Figure 4:
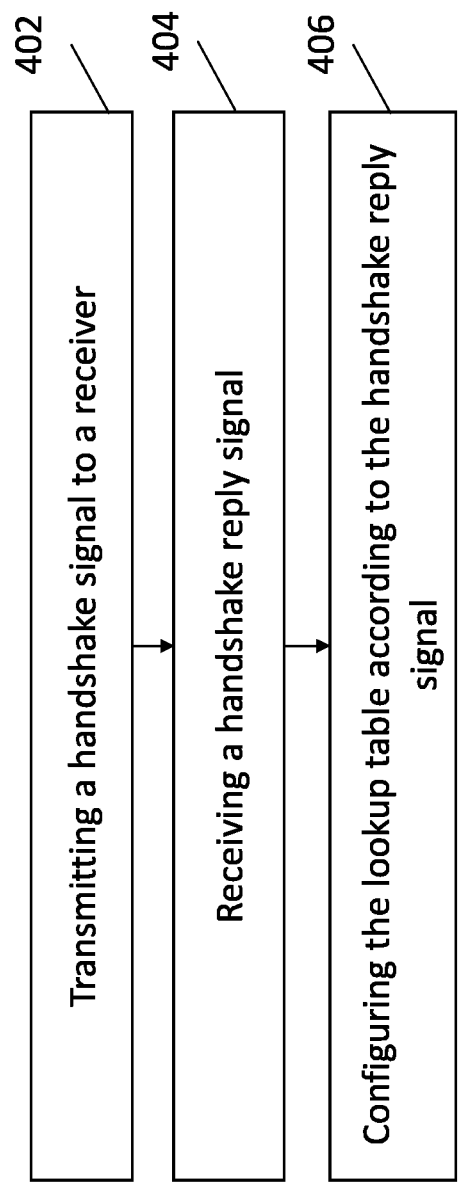
Figure 5:
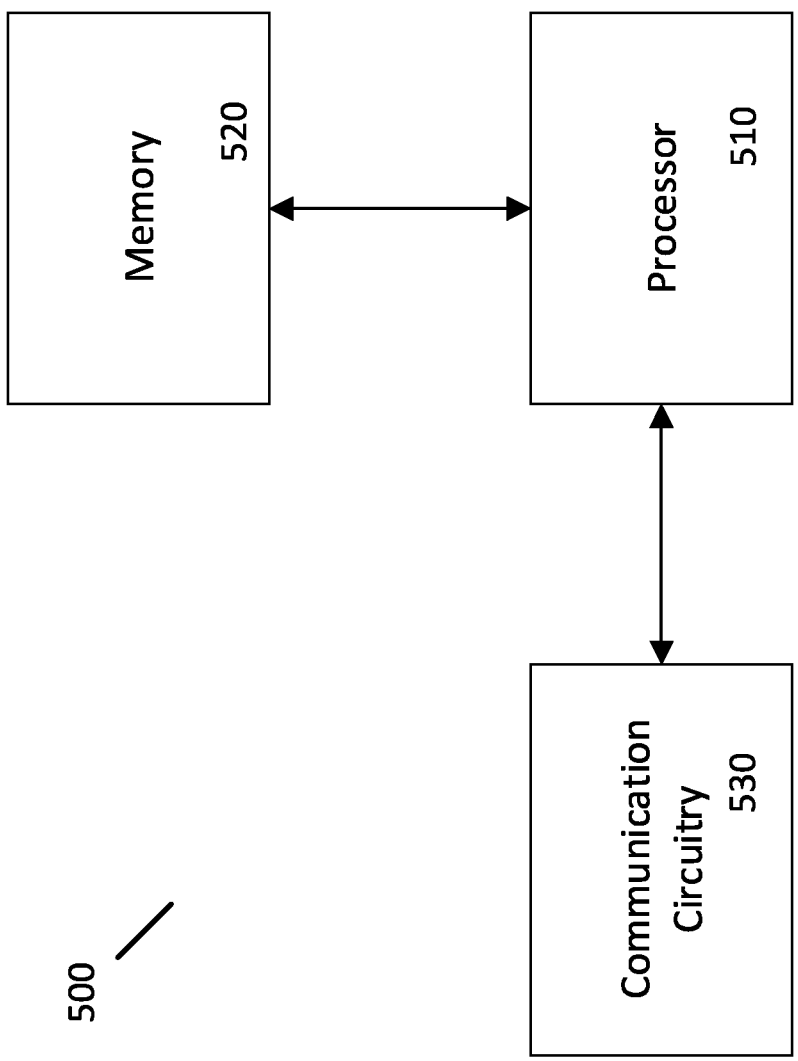
Figure 6:
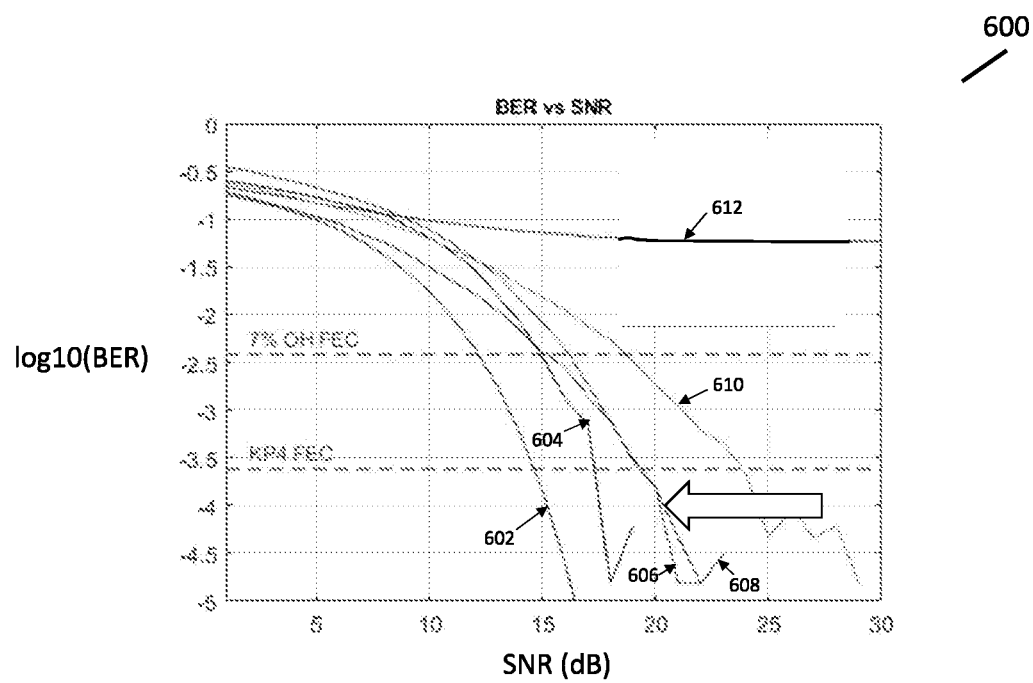
Figure 7:
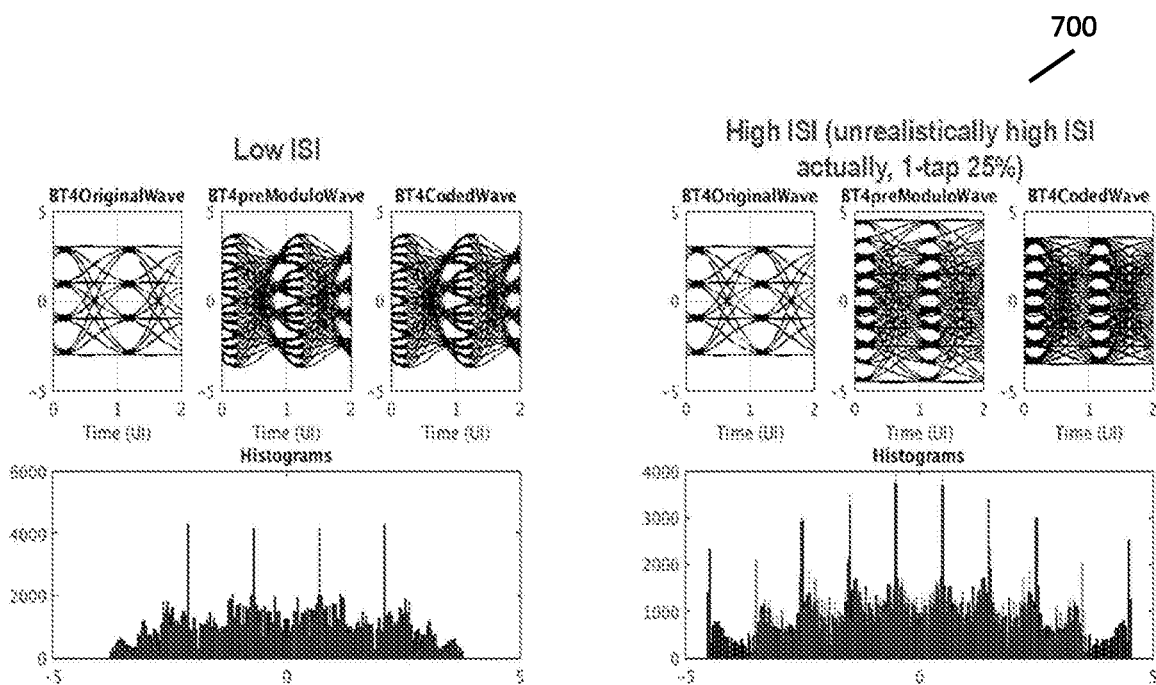

Having thus described the disclosure in general terms, reference will now be made to the accompanying drawings, which are not necessarily drawn to scale, and wherein:

FIG. 1 illustrates a block diagram of an example communication system employing a decision-feedback equalizer (DFE) at a receiver and an example communication system employing Tomlison-Harashima precoding (THP) equalization;

FIG. 2 illustrates an example lookup table with two input symbols according to example embodiments of the present invention;

FIG. 3 is a flowchart illustrating an example method of coding a signal to be transmitted via a communication channel according to example embodiments of the present invention;

FIG. 4 is a flowchart illustrating an example method of a performing handshake with the receiver;

FIG. 5 illustrates an example computing system that may be embedded in the communication system;

FIG. 6 illustrates an example graph related to one or more embodiments disclosed herein; and FIG. 7 illustrates an example eye diagram related to one or more embodiments disclosed herein.

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "exemplary" and "example" as may be used herein are not provided to convey any qualitative assessment, but instead merely to convey an illustration of an example. Thus, use of any such terms should not be taken to limit the spirit and scope of embodiments of the present invention.

Embodiments of the present disclosure are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices/entities, computing entities, and/or the like carrying out instructions, operations, steps, and similar words used interchangeably (e.g., the executable instructions, instructions for execution, program code, and/or the like) on a computer-readable storage medium for execution. For example, retrieval, loading, and execution of code may be performed sequentially such that one instruction is retrieved, loaded, and executed at a time. In some exemplary embodiments, retrieval, loading, and/or execution may be performed in parallel such that multiple instructions are retrieved, loaded, and/or executed together. Thus, such embodiments can produce specifically-configured machines performing the steps or operations specified in the block diagrams and flowchart illustrations. Accordingly, the block diagrams and flowchart illustrations support various combinations of embodiments for performing the specified instructions, operations, or steps.

The field of high performance computing (HPC) and data center (DC) communications continuously experiences a tremendous growing demand for high capacity, low latency, low power consumption, and a small footprint of interconnects. Various applications, such as HPC clustering, deep learning, cloud computing and storage, and mobile systems, all benefit from high capacity, low latency, low power consumption, and a small footprint of interconnects. After information is digitized, such information will most likely be processed or stored by HPC or DC infrastructure at some stage.

In HPC, computer-networking communications standards such as InfiniBand feature a very high throughput and very low latency physical layer. As HPC systems are being pushed for more capacity, DC environments have benefited from the developments and have adopted the new technologies, adjusting them to their own requirements (e.g., lower cost and lower power consumption). These requirements are traditionally met by relaxing the requirements in terms of, for example, bit-error rate (BER) targets and tolerating slightly less capacity.

However, relaxing such requirements may not be preferred depending on the applications to be run and the operations to be conducted. In order to support the connectivity requirements of DC and HPC clusters, interconnects have experienced a rapid evolution from 14G, 28G, 50G, and now towards 100G per single lane. This incremental growth has faced some bottlenecks when utilizing traditional non-return to zero (NRZ) modulation mechanisms. As a result, pulse amplitude modulation (PAM)-4 is being adopted. PAM-4 offers twice the capacity compared to non-return to zero (NRZ) roughly over the same bandwidth. There are some challenges that, if properly resolved, can pave the way to continue scaling up PAM-4 systems in the future.

A common representation to convert pairs of bits into a PAM-4 map is direct mapping in the form of input={00,01, 10,11} becoming output={−3,−1,1,3} when mapped into analog values. To reduce the errors in case of incorrect recovery, Gray coding may be applied, ensuring only one bit changes between adjacent symbols. This leads to a conversion in the form of input={00,01,10,11}, which is Gray coded to input={00,01,11,10}, which becomes output={−3,−1,1,3} when mapped into analog values. The mapping from two bits to a single value on a PAM-4 signal allows for increased spectral efficiency. This increased spectral efficiency in the modulation formats allows for reducing the bandwidth requirements of all the building blocks in the end-to-end link channel.

An end-to-end link channel may be composed of different blocks whose frequency responses are limited: laser sources, photodiodes, trans-impedance amplifiers, amplifiers, modulator drivers, bond wires connections, and optical fibers. To ensure an acceptable signal integrity in an end-to-end link, the systems need to make sure distortions of the signal caused by the channel are properly compensated, such as by implementing equalization at the receiver or the transmitter, or by implementing precoding at the transmitter.

Equalization may be implemented through feed-forward equalizers (FFE). FFE equalizers are implemented using digital finite impulse response (FIR) filters: FIR filters have pre-cursor and post-cursor taps, each with a different weight, which match the inverse of the impulse response of the end-to-end link, thereby effectively equalizing signals transmitted over such link. FFE equalizers can be placed at the transmitter, the receiver, or both sides simultaneously. Alternatively, decision-feedback equalizers (DFE) may be placed at the receiver to equalize for post-cursor interference. A DFE takes a sample of the current recovered bit, applies the inverse of the channel transfer function, estimating the amount of post-cursor interference, and subtracts that amount from the incoming signal, thereby allowing a proper recovery of the next bit.

DFE provides many advantages, such as no noise enhancement, performance approaching the Shannon capacity of the underlying channel, and compatibility with adaptive algorithms to determine the transfer function of the channel. However, DFE yields negative error propagation effects at low signal-to-noise-ratio (SNR) and requires all computational operations to be conducted within less than 1 UI, which presses the electronic design and implementation as line rates increase. Therefore, for high bit rates and high line rate demands, such as a line rate higher than 50 Gigabits per second, DFE might not be a practical option due to electronic design constraints.

Precoding mechanisms, such as dirty paper coding (DPC) or Costa precoding, Tomlison-Harashima precoding (THP), or the like, provide a method to implement the DFE functionality at the transmitter rather than at the receiver. For example, THP consists of a decision system at the transmitter which generates a sequence based on the value of the current and the preceding bit. The preceding bit is used to equalize the current bit, by applying the inverse of the impulse response channel (post-cursor compensation). The equalized signal is then passed through a modulo unit associated with a modulo signal processing operation.

FIG. 1 illustrates a block diagram of an example communication system employing a DFE at the receiver 100A and an example communication system 100B employing THP equalization. As illustrated in FIG. 1, in system 100A the transmitter 102A transmits a signal to a receiver 106A via a channel 104A. The receiver 106A implements a DFE receiver that compensates for distortions caused by the channel. In system 100B, the transmitter 102B implements precoding that compensates for distortions caused by the channel, then transmits the precoded signal to the receiver 106B via the channel 104B.

FIG. 2 illustrates an example lookup table with two input symbols. The two input symbols, main symbol N and a pre-cursor, are each comprised of a least significant bit and a most significant bit and an output of M bits. A lookup table may have more than two input symbols with different numbers of pre-cursor symbols and post-cursor symbols. The M bits may be used as an input to a digital-to-analog converter.

FIG. 3 is a flowchart illustrating an example method of coding a signal to be transmitted via a communication channel in accordance with embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 3 may, for example, be performed by an example computing system 500 (shown in FIG. 5) that is embedded in a communication system, such as a transmitter in a communication system.

In some embodiments, at operation 302, the computing system 500 is configured to receive a signal to be transmitted. In some embodiments, the computing system 500 is a firmware computing system embedded in a transmitter of a communication system. In some embodiments, the signal to be transmitted may be received from another device that is configured to transmit information via signal by utilizing the communication system. In some embodiments, the signal to be transmitted may be a digit signal comprising one or more bits. In some embodiments, the signal to be transmitted is a pulse amplitude modulation 4 (PAM-4) signal.

In some embodiments, at operation 304, the computing system 500 is configured to convert the signal to be transmitted into a converted analog signal using an embedded digital to analog converter. In some embodiments, the digital to analog converter may be communicatively coupled with, or may otherwise be made available to, the computing system 500. In some cases, the computing system 500 may be a firmware computing system communicatively coupled with, and configured to control, one or more circuit modules in the communication system.

In some embodiments, at operation 306, the computing system 500 is configured to receive channel state information for a channel. The channel may, for example, be a channel through which the signal to be transmitted is expected to be transmitted. In some embodiments, operation 306 occurs before operations 302 and 304 so that the computing system may receive channel state information before receiving a signal to be transmitted. In some embodiments, the computing system 500 is configured to determine the channel state information based on one or more filters associated with the channel. For example, in some embodiments, the computing system 500 is configured to determine the channel state information based on an impulse response of one or more filters associated with the channel. In some embodiments, the computing system 500 is configured to determine the channel state information based on a statistical characterization of the channel. In some embodiments, the computing system 500 is configured to determine the channel state information based on a handshake signal communicated between the transmitter and the receiver. In some embodiments, the channel state information can be stored in the memory 520.

In some embodiments, the channel state information includes information indicative of an expected distortion that the channel may introduce, such as channel distortion estimation information. The channel distortion estimation information can be related to linear phenomena associated with the channel and/or non-linear phenomena associated with the channel. Additionally or alternatively, in some embodiments, the channel state information includes statistics associated with symbols associated with the channel. For example, in some embodiments, the channel state information additionally or alternatively includes inter-symbol interference information associated with the channel. Additionally or alternatively, in some embodiments, the channel state information includes channel response information associated with the channel. Additionally or alternatively, in some embodiments, the channel state information can be generated based on a channel transfer function (e.g., an end-to-end channel transfer function) associated with the channel. For instance, in some embodiments, the handshake signal can be impacted by the channel transfer function while traversing through the channel, thereby generating the channel state information. In some embodiments, the handshake signal can include different analog levels configured in a predefined manner. Furthermore, the handshake signal can include a set of transitions. In an aspect, the handshake signal can apply a particular transfer function to analog segments of the handshake signal to facilitate generation of the channel state information.

In some embodiments, at operation 308, the computing system 500 is configured to calibrate a lookup table based on the channel state information. The lookup table can be configured to map one or more input values to an output value. In some embodiments, the lookup table is a hardware-based lookup table circuit embedded in the communication system and controlled by the computing system 500. For example, the hardware-based lookup table circuit can include one or more hardware gates, one or more hardware latches, one or more hardware relays, and/or one or more other hardware components. In some embodiments, operation 308 occurs before operations 302 and 304 so that the computing system may calibrate the lookup table before receiving a signal to be transmitted. In some embodiments, the lookup table may be embedded in a clock-data recovery unit based on the lookup table. In an embodiment, one or more transitions of the lookup table can be tuned based on the channel state information. A transition of the lookup table can include an initial state and an end state. Additionally, in certain embodiments, hardware components of the lookup table can be associated with corresponding transitions. For example, in certain embodiments, a transition of the lookup table can include one or more interconnections and/or one or more hardware components. In another embodiment, a weight of one or more hardware components of the lookup table can be tuned based on the channel state information. For instance, a weight of one or more hardware components of the lookup table can be repeatedly tuned based on the channel state information until a signal to be transmitted satisfies a defined quality criterion.

In some embodiments, at operation 310, the computing system 500 may utilize the calibrated lookup table to generate, by at least using the converted analog signal as an input to the lookup table, a coded analog signal based on the converted analog signal. The lookup table may, in some cases, be used to implement different coding, such as Costa precoding, Tomlinson-Harashima precoding, Gray coding, or the like. In some embodiments, the coded analog signal has one or more of a symbol duration, an amplitude, or other signal parameters adjusted based on the lookup table. In some embodiments, the calibrated lookup table may also be configured to take into account equalization of the signal (such as by having the lookup table values adjusted to take equalization into account). For example, in some embodiments related to equalization, an input value of the calibrated lookup table can be weighted to match a desired output value that contains an equalization factor. In another embodiment related to coding, an input value of the calibrated lookup table can be weighted based on a digital value associated with the coding. For example, in certain embodiments, an input value of the calibrated lookup table can be weighted based on a digital value associated with Costa precoding, a digital value associated with Tomlinson-Harashima precoding, or a digital value associated with Gray coding. In some embodiments, the calibrated lookup table may be configured to perform coding only, and a second calibrated lookup table that is similarly calibrated may be utilized to perform equalization.

In some embodiments, at operation 312, the computing system 500 transmits the coded analog signal to a receiver via the channel for which the computing system previously received channel information.

In some embodiments, the transmitter embedding the computing system 500 may communicate with a receiver that may embed another computing system to perform a handshake before transmitting the signal or before generating the coded analog signal. In an embodiment, the handshake can be associated with a discovery process related to a communication protocol. FIG. 4 is a flowchart illustrating an example method of performing handshake with the receiver. As illustrated in FIG. 4, at operation 402, the computing system 500 may transmit a handshake signal to a receiver. The handshake signal may be a signal for exchanging information on whether the receiver has a firmware computing system embedded and whether the receiver is capable of decoding one or more of the coding mechanisms employed by the computing system 500. In some embodiments, the handshake signal may be transmitted during a communication link set up. In an embodiment, the communication link set up can also be associated with the discovery process related to the communication protocol.

At operation 404, the transmitter may receive a handshake reply signal from the receiver. The handshake reply signal may indicate whether the receiver is capable of decoding one or more of a Gray coded signal, a Costa precoded signal, or a Tomlinson-Harashima coded signal.

At operation 406, the transmitter may configure the lookup table according to the received handshake reply signal. For example, if the handshake reply signal indicates that the receiver is configured to decrypt a Tomlinson-Harashima coded received signal by utilizing a receiver-side lookup table embedded in a receiver-side chipset with a central processing unit (CPU); the transmitter may configure the calibrated lookup table to perform Tomlinson-Harashima coding. In another example, if the handshake reply signal indicates that the receiver is configured to decrypt a Costa precoded received signal by utilizing a receiver-side lookup table embedded in a receiver-side chipset with a central processing unit (CPU); the transmitter may configure the calibrated the calibrated lookup table to perform Costa precoding. In another example, if the handshake reply signal indicates that the receiver is not configured to decrypt a precoded signal, the transmitter may configure the lookup table to implement equalization only.

In an embodiment related to a transmitter, the look-up table of the transmitter can receive a sequence of digital data (e.g., a sequence of ones and zeroes) as input. Based on a type of coding and/or the equalization process, the look-up table of the transmitter can generate a coded analog signal. In certain embodiments, a computing system (e.g., computing system 500) can determine one or more weights for one or more hardware components of the look-up table of the transmitter. In an aspect, the one or more weights can be determined based on the coding and/or the equalization. Furthermore, the transmitter can transmit the coded analog signal to a receiver.

In another embodiment related to a receiver, the look-up table of the receiver can receive a coded analog signal as input. The coded analog signal can be provided by a transmitter. Based on a type of coding and/or the equalization process, the look-up table of the receiver can generate a sequence of digital data (e.g., a sequence of ones and zeroes). In certain embodiments, a computing system (e.g., computing system 500) can determine one or more weights for one or more hardware components of the look-up table of the receiver. In an aspect, the one or more weights can be determined based on the coding and/or the equalization. In one example, the look-up table of the receiver can swap one or more bits of a sequence of digital data to demodulate coding (e.g., Gray coding) conducted at the transmitter.

In some embodiments, the handshake signal can be impacted by an end-to-end channel transfer function while traversing a channel, thereby producing channel state information that can be employed to generate one or more weights of the look-up table. For example, at a receiving side of the handshake path, the channel state information can be extracted to support generation of one or more equalization weights for the look-up table.

In some embodiments, the handshake signal can include different analog levels configured in a predefined manner. The handshake signal can also include a set of transitions. In an aspect, the handshake signal (e.g., traversing a channel) can experience end-to-end channel performance and can imprint a particular transfer function to analog segments of the handshake signal. In some embodiments, the imprint can facilitate generation of the channel state information. Additionally, in some embodiments, an inverse transfer function can be employed to determine one or more weights for the look-up table.

FIG. 5 illustrates an example computing system 500 that may be embedded in the communication system. The computing system 500 may be a firmware computing system communicatively coupled with one or more circuit modules, such as the lookup table circuit illustrated in FIG. 2. The computing system 500 may include or otherwise be in communication with a processor 510, a memory circuitry 520, and communication circuitry 530. In some embodiments, the processor 510 (which may include multiple or co-processors or any other processing circuitry associated with the processor) may be in communication with the memory circuitry 520. The memory circuitry 520 may comprise non-transitory memory circuitry and may include one or more volatile and/or non-volatile memories. In some examples, the memory circuitry 520 may be an electronic storage device (e.g., a computer readable storage medium) configured to store data that may be retrievable by the processor 510. In some examples, the data stored in the memory 520 may include one or more sets of lookup table values, data for generating lookup table values based on channel state information and a desired coding mechanism, or the like for enabling the apparatus to carry out various functions or methods in accordance with embodiments of the present invention, described herein.

In some examples, the processor 510 may be embodied in a number of different ways. For example, the processor may be embodied as one or more of various hardware processing means such as a microprocessor, a coprocessor, a digital signal processor (DSP), a controller, or a processing element with or without an accompanying DSP. The processor 510 may also be embodied in various other processing circuitry including integrated circuits such as, for example, an FPGA (field programmable gate array), a microcontroller unit (MCU), an ASIC (application specific integrated circuit), a hardware accelerator, or a special-purpose electronic chip. Furthermore, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining, and/or multithreading. In some embodiments, the processor 510 is a microprocessor.

In an example embodiment, the processor 510 may be configured to execute instructions, such as computer program code or instructions, stored in the memory circuitry 520 or otherwise accessible to the processor 510. Alternatively or additionally, the processor 510 may be configured to execute hard-coded functionality. As such, whether configured by hardware or software instructions, or by a combination thereof, the processor 510 may represent a computing entity (e.g., physically embodied in circuitry) configured to perform operations according to an embodiment of the present invention described herein. For example, when the processor 510 is embodied as an ASIC, FPGA, or similar, the processor may be configured as hardware for conducting the operations of an embodiment of the invention. Alternatively, when the processor 510 is embodied to execute software or computer program instructions, the instructions may specifically configure the processor 510 to perform the algorithms and/or operations described herein when the instructions are executed. However, in some cases, the processor 510 may be a processor of a device (e.g., a mobile terminal or a fixed computing device) specifically configured to employ an embodiment of the present invention by further configuration of the processor using instructions for performing the algorithms and/or operations described herein. The processor 510 may further include a clock, an arithmetic logic unit (ALU) and logic gates configured to support operation of the processor 510, among other things.

The computing system 500 may optionally also include the communication circuitry 530. The communication circuitry may be any means embodied in either hardware or a combination of hardware and software that is configured to receive and/or transmit data from/to a network and/or any other device or module in communication with the computing system 500. In this regard, the communication interface may include, for example, supporting hardware and/or software for enabling communications. As such, for example, the communication circuitry 530 may include a communication modem and/or other hardware/software for supporting communication via cable, universal serial bus (USB), integrated circuit receiver, or other mechanisms.

FIG. 6 illustrates an example graph 600 related to one or more embodiments disclosed herein. The graph 600 illustrates bit error rate (BER) vs. signal-to-noise ratio (SNR) for a signal provided by a look-up table disclosed herein. In an embodiment, the graph 600 can be related to two transmitter models (e.g., vertical-cavity surface-emitting laser (VCSEL) models) each with direct current values equal to 7 mA, 8 mA and 9 mA, and peak-to-peak voltage values equal to 0.5 and 0.8. In one example, the two transmitter models can be related to an electrical back to back (EBTB) test and an optical back to back (OBTB) test. As shown in the graph 600, a BER curve 602 is related to a theoretical limit, a BER curve 604 is related to OBTB with a first type of equalization (e.g., DFE), a BER curve 606 is related to OBTB with a second type of equalization (e.g., THP), a BER curve 608 is related to EBTB with no equalization, a BER curve 610 is related to OBTB with a third type of equalization (e.g., LPE), and a BER curve 612 is related to OBTB with no equalization.

FIG. 7 illustrates an example eye diagram 700 related to one or more embodiments disclosed herein. For example, the eye diagram 700 can be an eye diagram for a signal associated with a look-up table disclosed herein.

Many modifications and other embodiments of the present inventions set forth herein will come to mind to one skilled in the art to which these inventions pertain having the benefit of the teachings presented in the foregoing descriptions and the associated drawings. Therefore, it is to be understood that the present inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:
1. A method for coding a signal to be transmitted via a communication channel, comprising:
  receiving a signal to be transmitted;
  converting the signal into a converted analog signal using a digital to analog converter;

receiving channel state information for a channel;
calibrating a lookup table based on the channel state information;
utilizing the calibrated lookup table to generate a coded analog signal based on the converted signal; and
transmitting the coded analog signal, wherein the coded signal compensates for channel distortion of the channel.

2. The method of claim 1, wherein the signal to be transmitted is a pulse amplitude modulation 4 (PAM-4) signal.

3. The method of claim 2, wherein the converted analog signal comprises three eyes, and wherein the coded analog signal comprises three eyes.

4. The method of claim 1, wherein the coded analog signal is Gray coded by utilizing the calibrated lookup table.

5. The method of claim 1, wherein the coded analog signal is Costa precoded by utilizing the calibrated lookup table.

6. The method of claim 1, wherein the coded analog signal is Tomlinson-Harashima coded by utilizing the calibrated lookup table.

7. The method of claim 6, wherein utilizing the lookup table to generate a coded analog signal based on the converted signal comprises:
transmitting a handshake signal to a receiver;
receiving a handshake reply signal from the receiver indicating that the receiver is configured to decrypt a Tomlinson-Harashima coded received signal by utilizing a receiver-side lookup table embedded in a receiver-side chipset with a central processing unit (CPU); and
configuring the calibrated lookup table to perform Tomlinson-Harashima coding.

8. The method of claim 7, wherein the receiver-side lookup table is adjustable.

9. The method of claim 6, wherein utilizing the lookup table to generate a coded analog signal based on the converted signal comprises:
transmitting a handshake signal to a receiver;
receiving a handshake reply signal from the receiver indicating that the receiver is configured to decrypt a Tomlinson-Harashima coded received signal by utilizing a field-programmable gate array (FPGA); and
configuring the calibrated lookup table to perform Tomlinson-Harashima coding.

10. The method of claim 1, wherein the lookup table is further configured to include equalization.

11. An apparatus in a transmitter comprising at least one processor and at least one memory including computer program code, the at least one memory and the computer program code configured to, with the at least one processor:
receive a signal to be transmitted;
convert the signal into a converted analog signal using a digital to analog converter;
receive channel state information for a channel;
calibrate a lookup table based on the channel state information;
utilize the calibrated lookup table to generate a coded analog signal based on the converted signal; and
transmit the coded analog signal, wherein the coded signal compensates for channel distortion of the channel.

12. The apparatus of claim 11, wherein the signal to be transmitted is a pulse amplitude modulation 4 (PAM-4) signal.

13. The apparatus of claim 12, wherein the converted analog signal comprises three eyes, and wherein the coded analog signal comprises three eyes.

14. The apparatus of claim 11, wherein the coded analog signal is Gray coded by utilizing the calibrated lookup table.

15. The apparatus of claim 11, wherein the coded analog signal is Costa precoded by utilizing the calibrated lookup table.

16. The apparatus of claim 11, wherein the coded analog signal is Tomlinson-Harashima coded by utilizing the calibrated lookup table.

17. The apparatus of claim 16, wherein the at least one memory and the computer program code are further configured to:
transmit a handshake signal to a receiver;
receive a handshake reply signal from the receiver indicating that the receiver is configured to decrypt a Tomlinson-Harashima coded received signal by utilizing a receiver-side lookup table embedded in a receiver-side chipset with a central processing unit (CPU); and
configure the calibrated lookup table to perform Tomlinson-Harashima coding.

18. The apparatus of claim 17, wherein the receiver-side lookup table is adjustable.

19. The apparatus of claim 16, wherein the at least one memory and the computer program code are further configured to:
transmit a handshake signal to a receiver;
receive a handshake reply signal from the receiver indicating that the receiver is configured to decrypt a Tomlinson-Harashima coded received signal by utilizing a field-programmable gate array (FPGA); and
configure the calibrated lookup table to perform Tomlinson-Harashima coding.

20. The apparatus of claim 11, wherein the lookup table is further configured to include equalization.

* * * * *